US010319604B2

(12) United States Patent
Duan et al.

(10) Patent No.: US 10,319,604 B2
(45) Date of Patent: Jun. 11, 2019

(54) METHODS FOR SELF-ALIGNED PATTERNING

(71) Applicant: Applied Materials, Inc., Santa Clara, CA (US)

(72) Inventors: Ziqing Duan, San Jose, CA (US); Yihong Chen, San Jose, CA (US); Abhijit Basu Mallick, Palo Alto, CA (US); Srinivas Gandikota, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 15/805,764

(22) Filed: Nov. 7, 2017

(65) Prior Publication Data

US 2018/0130671 A1    May 10, 2018

Related U.S. Application Data

(60) Provisional application No. 62/419,235, filed on Nov. 8, 2016.

(51) Int. Cl.
| | | |
|---|---|---|
| *H01L 21/00* | (2006.01) | |
| *H01L 21/321* | (2006.01) | |
| *H01L 21/311* | (2006.01) | |
| *H01L 21/3205* | (2006.01) | |
| *H01L 21/02* | (2006.01) | |
| *H01L 21/285* | (2006.01) | |
| *H01L 21/3213* | (2006.01) | |

(52) U.S. Cl.
CPC .. *H01L 21/32115* (2013.01); *H01L 21/02175* (2013.01); *H01L 21/02244* (2013.01); *H01L 21/02247* (2013.01); *H01L 21/28568* (2013.01); *H01L 21/31111* (2013.01); *H01L 21/32051* (2013.01); *H01L 21/32135* (2013.01); *H01L 21/32136* (2013.01)

(58) Field of Classification Search
CPC ........ H01L 21/32115; H01L 21/02175; H01L 21/02244; H01L 21/28568; H01L 21/31111; H01L 21/32051
See application file for complete search history.

(56) References Cited

U.S. PATENT DOCUMENTS

| | | | |
|---|---|---|---|
| 8,575,753 B2 | 11/2013 | Choi et al. | |
| 8,951,429 B1 | 2/2015 | Liu et al. | |
| 10,083,834 B2* | 9/2018 | Thompson | .......... H01L 21/0338 |
| 2004/0067649 A1* | 4/2004 | Hellring | ................. B82Y 30/00 |
| | | | 438/689 |
| 2005/0167846 A1 | 8/2005 | Aoyama | |

(Continued)

FOREIGN PATENT DOCUMENTS

JP    2008108757 A    5/2008

OTHER PUBLICATIONS

PCT International Search Report and Written Opinion in PCT/US2017/060367 dated Feb. 22, 2018, 9 pages.

*Primary Examiner* — Mounir S Amer
*Assistant Examiner* — Alexander Belousov
(74) *Attorney, Agent, or Firm* — Servilla Whitney LLC

(57)    ABSTRACT

Processing methods comprising depositing a film on a substrate surface and in a surface feature with chemical planarization to remove the film from the substrate surface, leaving the film in the feature. A pillar is grown from the film so that the pillar grows orthogonally to the substrate surface.

19 Claims, 1 Drawing Sheet

(56) References Cited

U.S. PATENT DOCUMENTS

| | | |
|---|---|---|
| 2009/0269569 A1 | 10/2009 | Fucsko et al. |
| 2011/0049568 A1* | 3/2011 | Lochtefeld ........ H01L 21/02381 257/190 |
| 2013/0072019 A1 | 3/2013 | Ryan |
| 2015/0279736 A1* | 10/2015 | Hotta ................ H01L 21/28556 438/660 |
| 2018/0096847 A1* | 4/2018 | Thompson .......... H01L 21/0338 |

* cited by examiner

METHODS FOR SELF-ALIGNED PATTERNING

CROSS-REFERENCE TO RELATED APPLICATIONS

This application claims priority to U.S. Provisional Application No. 62/419,235, filed Nov. 8, 2016, the entire disclosure of which is hereby incorporated by reference herein.

TECHNICAL FIELD

The present disclosure relates generally to methods of depositing and etching thin films. In particular, the disclosure relates to processes for forming self-aligned patterning.

BACKGROUND

The semiconductor industry is rapidly developing chips with smaller and smaller transistor dimensions to gain more functionality per unit area. As the dimensions of devices continue to shrink, so does the gap/space between the devices, increasing the difficulty to physically isolate the devices from one another. Filling in the high aspect ratio trenches/spaces/gaps between devices which are often irregularly shaped with high-quality dielectric materials is becoming an increasing challenge to implementation with existing methods including gapfill, hardmasks and spacer applications.

Integrated circuits are made possible by processes which produce intricately patterned material layers on substrate surfaces. Producing patterned materials on a substrate requires controlled methods for removal of exposed material. Chemical etching is used for a variety of purposes including transferring a pattern in photoresist into underlying layers, thinning layers or thinning lateral dimensions of features already present on the surface. Often it is desirable to have an etch process which etches one material faster than another helping, for example, pattern transfer processes. Such an etch process is said to be selective of the first material. As a result of the diversity of materials, circuits and processes, etch processes have been developed that selectively remove one or more of a broad range of materials.

Dry etch processes are often used for selectively removing material from semiconductor substrates. The dry etch process has the ability to gently remove material from miniature structures with minimal physical disturbance. Dry etch processes also allow the etch rate to be abruptly stopped by removing the gas phase reagents. Some dry-etch processes involve the exposure of a substrate to remote plasma by-products formed from one or more precursors. Many dry etch processes have recently been developed to selectively remove a variety of dielectrics relative to one another. However, relatively few dry-etch processes have been developed to selectively remove metal-containing materials. Methods are needed to broaden the process sequences to various metal-containing materials.

As the feature size of circuits and semiconductor devices keeps shrinking for higher integration density of electronic components, the self-aligned contact is becoming more and more attractive and highly required to solve increasingly-appeared patterning difficulties. Generally, making the self-aligned contact needs bottom-up pillars, which however are very hard to be formed, especially when the material, shape, feature size, direction etc. are highly restricted. Typically, formation of self-aligned pillars takes multi-step processes using different tools, increasing the cost of the fabrication and generating more difficulties with low productivity. So far, most bottom-up pillars developed for self-aligned contacts are conductive metals, vertically aligned with submicron feature size and uncontrollable shapes.

Therefore, there is a need in the art for new methods for self-aligned patterning processes.

SUMMARY

One or more embodiments of the disclosure are directed to processing methods comprising providing a substrate with a substrate surface having at least one feature extending into the substrate from the substrate surface. The feature has a bottom and sidewalls. A first film is deposited on the substrate surface so that the first film covers the substrate surface and fills the feature. The substrate surface is chemically planarized by sequentially oxidizing a top of the first film to form an oxidized first film on top of the first film and etching the oxidized first film to remove the oxidized first film. The sequential oxidizing and etching is repeated to remove the first film from the substrate surface leaving the first film in the feature. The first film is expanded to grow a first pillar in the feature that extends from the feature orthogonally to the substrate surface.

Additional embodiments of the disclosure are directed to processing methods comprising providing a substrate with a substrate surface having at least one feature extending into the substrate from the substrate surface. The feature has a bottom and sidewalls. A first film comprising a metal is deposited on the substrate surface so that the first film covers the substrate surface and fills the feature. The substrate surface is chemically planarized by sequentially oxidizing a top of the first film to form an oxidized first film on top of the first film and etching the oxidized first film to remove the oxidized first film. The sequential oxidizing and etching is repeated to remove the first film from the substrate surface leaving the first film in the feature. The first film is expanded to grow a first pillar in the feature that extends from the feature orthogonally to the substrate surface.

Further embodiments of the disclosure are directed to processing methods comprising providing a substrate with a substrate surface having at least one feature extending into the substrate from the substrate surface. The feature has a bottom and sidewalls. A first film is deposited on the substrate surface by sequential exposure to a metal precursor and a reactant to form a first film that covers the substrate surface and fills the feature. The first film comprises tungsten metal and the metal precursor comprising a tungsten halide. The substrate surface is chemically planarized by sequentially oxidizing a top of the first film to form an oxidized first film on top of the first film and etching the oxidized first film by exposure to the same tungsten halide compound as the metal precursor to remove the oxidized first film. The sequential oxidizing and etching is repeated to remove the first film from the substrate surface leaving the first film in the feature. The first film is expanded by one or more of oxidizing or nitriding the first film to grow a first pillar in the feature that extends from the feature orthogonally to the substrate surface. Depositing the first film and chemically planarizing the substrate surface occurs in the same processing chamber.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1A:
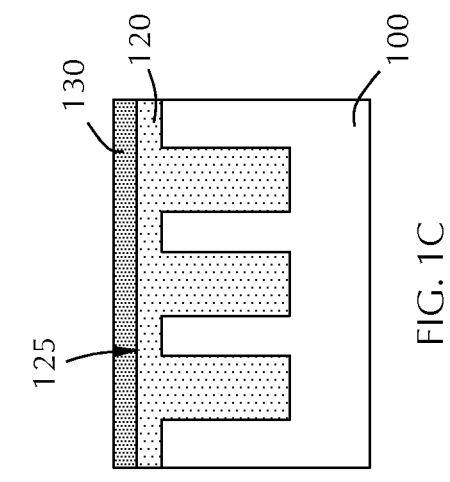
FIGS. 1A-1F show cross-sectional views of a process sequence in accordance with one or more embodiment of the disclosure.

Before describing several exemplary embodiments of the invention, it is to be understood that the invention is not limited to the details of construction or process steps set forth in the following description. The invention is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present invention, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

Some embodiments of the disclosure provide self-assembled metal oxide (e.g., tungsten oxide) pillars through oxidizing gap-filled metal films. Generally, embodiments of the disclosure deposit a metal on a structure (or feature) of holes and trenches by ALD or CVD and oxidize the metal film to form a metal oxide. Oxidizing the film causes the metal oxide to expand volumetrically, growing a pillar from the feature. In order to form separate pillars, generally, the metal deposited on the top surface of the structure is removed after the metal deposition. Removal can be done by etching or chemical-mechanical planarization (CMP). Either process is performed by moving the wafer out of the processing chamber to another tool, reducing the overall throughput of the process.

One or more embodiments of the disclosure are directed to methods to form self-assembled pillars in one process chamber without breaking the vacuum. Firstly, the substrate with featured structures is deposited with a metal film (e.g., tungsten) in an ALD chamber. Then the metal film is partially oxidized I the same chamber; either thermally or by plasma enhancement. After oxidation, a metal halide precursor (e.g., $WCl_5$, $WCl_6$, etc.) is flowed to the chamber to etch away the metal oxide. The inventors have observed that there is a very high etch selectivity to the metal film. The metal oxide can be etched away by using fluorine radicals (e.g., flowing $NF_3$, $C_4F_6$)—with or without CCP or ICP plasma. This can be done in the same chamber without breaking the vacuum. Through multiple cycles of oxidation and etching, the metal film deposited on the top surface of the structure will be fully removed. Further oxidation will lead to the separate pillar growth.

In some embodiments, the metal deposition, oxidation and chemical etch processes are performed in a single process chamber without breaking vacuum. This single chamber process can increase throughput and decrease the cost per wafer.

In some integration schemes, oxide films (e.g., tungsten oxide) are selectively etched relative to a dielectric and metal films (e.g., not oxidized tungsten). Embodiments of the disclosure provide methods using metal halides for complete etching of oxides selective to metal and dielectric films. In some cases, the oxide film being etched sticks above the surface of the substrate. In some embodiments, the oxide film being etched sticks above the surface of the dielectric. In one or more embodiments, the oxide being etched is surrounded by a mask.

One or more embodiments of the disclosure are directed to methods for depositing metal oxide films for any conformal and/or low to high aspect ratio gap/trench/void filling applications. Embodiments of the disclosure advantageously provide methods of depositing a film (e.g., a metal oxide film) in high aspect ratio (AR) structures with small dimensions. Some embodiments of the disclosure advantageously provide methods of filling gaps without formation of a seam in the gap. One or more embodiments of the disclosure advantageously provide methods of forming self-aligned vias.

FIG. 1 shows a processing method in accordance with one or more embodiments of the disclosure. Referring to FIG. 1A, a substrate 100 with a substrate surface 105 is provided. The substrate 100 has at least one feature 110 extending into the substrate 100 a depth from the substrate surface 105. The feature 110 has a bottom 102 and sidewalls 104. The open area formed by the sidewalls and bottom are also referred to as a gap or trench.

The Figures show substrates having three features 110 for illustrative purposes; however, those skilled in the art will understand that there can be more than one feature. The shape of the feature 110 can be any suitable shape including, but not limited to, trenches and cylindrical vias. As used in this regard, the term "feature" means any intentional surface irregularity. Suitable examples of features include, but are not limited to trenches which have a top, two sidewalls and a bottom, peaks which have a top and two sidewalls extending upward from a surface and vias which have sidewalls extending down from a surface with an open bottom. Features can have any suitable aspect ratio (ratio of the depth of the feature to the width of the feature). In some embodiments, the aspect ratio is greater than or equal to about 5:1, 10:1, 15:1, 20:1, 25:1, 30:1, 35:1 or 40:1.

Figure 1B:
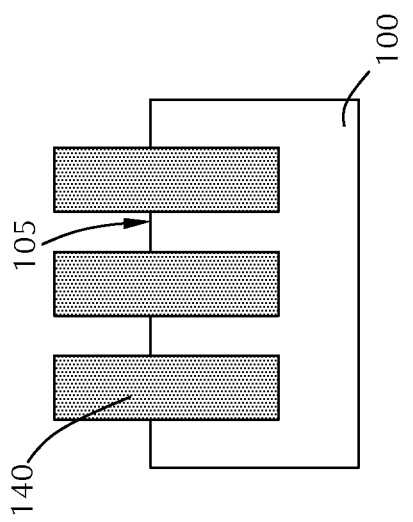

As shown in FIG. 1B, a first film 120 is deposited or formed on the substrate surface 105 so that the first film 120 covers the substrate surface 105 and fills the feature 110. The film 120 can be any suitable film formed by any suitable process including, but not limited to, chemical vapor deposition, plasma-enhanced chemical vapor deposition, atomic layer deposition, plasma-enhanced atomic layer deposition and/or physical vapor deposition. In some embodiments, the film 120 is formed by atomic layer deposition or plasma-enhanced atomic layer deposition.

In some embodiments, the film 120 is a metal film or a metal containing film. Suitable metal films include, but are not limited to, films including one or more of Co, Mo, W, Ta, Ti, Ru, Rh, Cu, Fe, Mn, V, Nb, Hf, Zr, Y, Al, Sn, Cr and/or La. In some embodiments, the metal film comprises tungsten. In some embodiments, the film consists essentially of the designated metal. For example, a film consisting essentially of tungsten means that the composition of the film is greater than or equal to about 95%, 98% or 99% tungsten atoms on an atomic basis.

In some embodiments, the film 120 is a continuous film. As used herein, the term "continuous" refers to a layer that covers an entire exposed surface without gaps or bare spots that reveal material underlying the deposited layer. A continuous layer may have gaps or bare spots with a surface area less than about 1% of the total surface area of the film.

In some embodiments, the film 120 is formed substantially seamlessly within the feature 110. In some embodiments, a seam (not shown) may be formed within the width W of the feature 110. The seam can be any gap, space or void that forms between the sidewalls 104 of the feature 110.

In some embodiments, the first film 120 is formed by an atomic layer deposition (ALD) process. The ALD process of some embodiments comprises sequential exposure of the substrate surface to a metal precursor and a reactant to deposit a metal film. In some embodiments, the metal precursor comprises a metal halide compound. The halogen can be any suitable halogen atoms and can be the same halogen or different halogens. For example, the metal precursor can be a metal chloride, a metal fluoride, a metal bromide, a metal iodide or a metal atom with a mixture of fluorine, chlorine, bromine or iodine atoms. In one or more embodiments, metal halide precursor comprises a tungsten halide. In some embodiments, the tungsten halide comprises one or more of $WCl_5$ or $WCl_6$. The ALD process can be either a time-domain process wherein the precursor and reactant species are not present in the processing chamber at the same time, or a spatial process wherein the precursor and reactant are provided to different parts of the processing chamber with a gas curtain separating the precursor and reactant to prevent gas-phase reactions. In a spatial ALD process, the substrate is moved from a first process region with the metal precursor to a second process region with the reactant.

In some embodiments, the film 120 is doped with a dopant prior to oxidation. The dopant can be incorporated into the film 120 at the same time as the formation of the film 120 or in a separate process sequentially with the film deposition. For example, depositing the film may occur followed by doping the film with the dopant in a separate process in either the same process chamber or a different process chamber. In some embodiments, the deposition of the film occurs with doping in a single process. For example, the film precursor and dopant can be coflowed into the processing chamber to form the film.

Some embodiments include an optional treatment process. The treatment process treats the film 130 to improve some parameter of the film. In some embodiments, the treatment process comprises annealing the film. In some embodiments, treatment can be performed by in-situ anneal in the same process chamber used for deposition and/or reduction. Suitable annealing processes include, but are not limited to, rapid thermal processing (RTP) or rapid thermal anneal (RTA), spike anneal, or UV cure, or e-beam cure and/or laser anneal. The anneal temperature can be in the range of about 500° C. to 900° C. The composition of the environment during anneal may include one or more of $H_2$, Ar, He, $N_2$, $NH_3$, $SiH_4$, etc. The pressure during the anneal can be in the range of about 100 mTorr to about 1 atm (760 Torr).

Figure 1C:
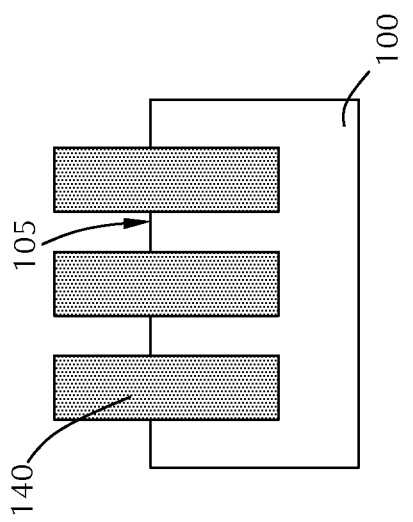

After formation of the film, as shown in FIG. 1C, the substrate surface 105 is chemically planarized. As used in this manner, the term "chemical planarization", and the like, means that the height of the subject film is decreased to remove at least a portion of the film. In some embodiments, chemically planarizing the substrate surface means that there is substantially no mechanical planarization processing.

Chemically planarizing the substrate surface 105 can be accomplished by sequentially oxidizing and etching the top 125 of the first film 120. The sequential oxidation/etching process is repeated until the predetermined amount of the first film has been removed. In some embodiments, the top 125 of the first film 120 is oxidized to form an oxidized first film 130 on top of the first film 130. Etching removes the oxidized first film 130 from the top of the first film 120. The amount of the first film 130 removed during any cycle of oxidation/etching will vary depending on, for example, the composition of the first film 130 and the oxidant and etchant used.

Figure 1D:
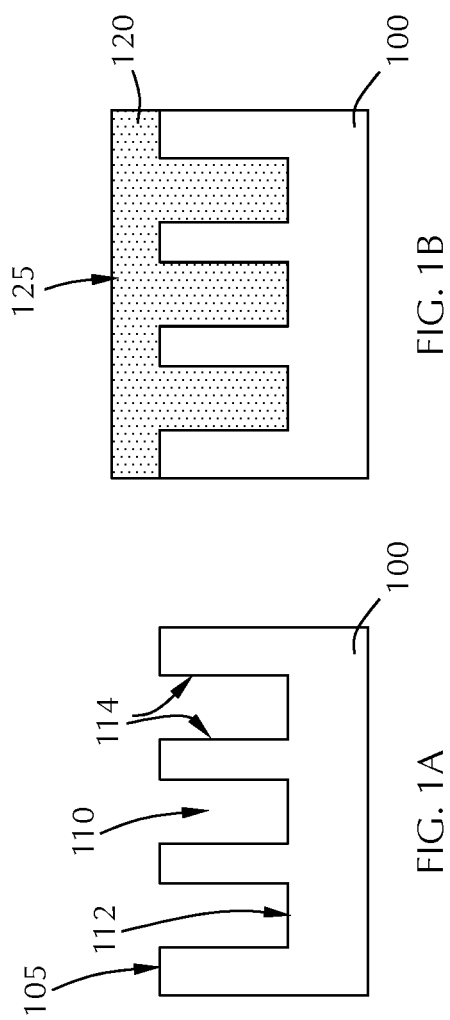
Figure 1E:
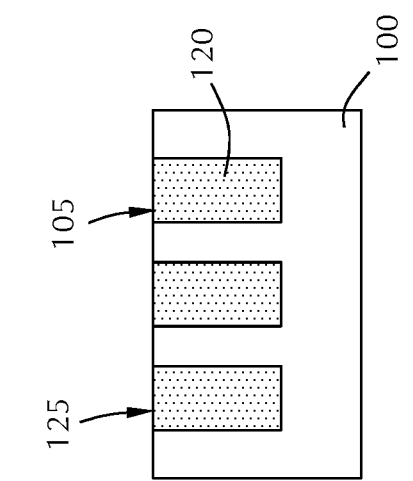

As shown in FIG. 1D, the height or thickness of the first film 120 on top of the substrate surface 105 is decreased with each cycle of oxidizing/etching. The oxidizing/etching process is repeated until the first film 120 is removed from the substrate surface 105 leaving the first film 120 in the feature 110 and the substrate surface 105 exposed, as shown in FIG. 1E.

In some embodiments, depositing the first film 130 and chemically planarizing the substrate surface 105 occurs in the same processing chamber. For example, a spatial ALD processing chamber can have alternating regions of metal precursor and reactant to deposit the first film 120 and then the gas supplies can be changed to an oxidant and etchant for the planarization process.

In some embodiments, etching the first film 120 comprises exposing the first film 102 to a metal halide compound. In one or more embodiments, the metal halide compound used for etching is the same compound as the metal halide precursor used for film deposition. In some embodiments, the etching compound and the metal precursor have different metal. In some embodiments, the etching compound and the metal precursor have the same metal with different substituent groups.

Etching can be done by any suitable technique. In some embodiments, etching comprises exposing the oxidized first film 130 to a metal halide compound. In some embodiments, the metal halide compound has a different metal than the first film.

In some embodiments, etching comprises exposure to a metal-and-halogen-containing precursor (e.g. $WCl_6$), also referred to as a metal halide precursor. The metal halide precursor can react with the oxidized first film 130.

In some embodiments, exposure to the metal halide precursor causes an exothermic reaction with the oxidized first film 130 and no plasma is present in the substrate processing region. No plasma excites the metal-halide precursor prior to entering the substrate processing region according to one or more embodiments.

In an exemplary non-limiting process, the first film 120 comprises tungsten and is expanded by reaction with oxygen to form the oxidized first film 130 tungsten oxide, which may take the form of $WO_3$. Without being bound by any particular theory of operation, it is believed that exposure of $WO_3$ to $WCl_6$ (or possibly $WCl_6$) forms volatile $WOCl_4$ and/or $WO_2Cl_2$ which leaves the surface until all tungsten oxide is removed. The reaction can spontaneously stop once the tungsten oxide portion (or metal oxide portion in general) is removed. The process can be repeated an integral number of cycles. Each cycle may remove a selectable amount of the original tungsten film (e.g. 1 or 2 monolayers).

In some embodiments, the metal halide precursor includes two or more or only two different elements including a metal element and a halogen element. The metal halide precursor may include only a single atom of the metal element but multiple atoms of the same halogen element (as is the case for $WCl_6$ and $WCl_5$). The metal element of the metal halide may include one or more of titanium, hafnium, zirconium, vanadium, niobium, tantalum, chromium, molybdenum, tungsten, manganese, rhenium, technetium, iron, aluminum and gallium in embodiments. In some embodiments, the metal element of the metal halide has an atomic number of 22, 23, 24, 40, 41, 42, 72, 73 or 74. In one or more embodiments, the metal element comprises an element of group 4, group 5 or group 6 of the periodic table or may be transition metals. The halogen element may be one of F and Cl according to one or more embodiments. The halogen element may be one or more of F, Cl, Br and/or I in some embodiments. In some embodiments, the metal-and-halogen-containing precursor fluorine-free. Some examples of suitable metal halide precursors include, but are not limited to, vanadium pentahalides, tantalum pentahalides, chromium hexahalides, molybdenum pentahalides, molybdenum hexahalides, niobium pentahalides, tungsten pentahalides, tungsten hexahalides, and manganese tetrahalides. In some embodiments, the metal halide precursors include, but are not limited to, vanadium halides, tantalum halides, chromium halides, molybdenum halides, niobium halides, tungsten halides and/or manganese halides, where the oxidation state of the metal element can be any suitable oxidation state.

In some embodiments, there is little or no local plasma used in the etch process to make etch processes more selective, delicate and isotropic. The term "plasma-free" will be used herein to describe the substrate processing region during application of no or essentially no plasma power to the substrate processing region. The etchants (the metal-and-halogen-containing precursor) described possess energetically favorable etch reaction pathways which enable the substrate processing region to be plasma-free during operations of etching metal-containing materials herein. Stated another way, the electron temperature in the substrate processing region may be less than 0.5 eV, less than 0.45 eV, less than 0.4 eV, or less than 0.35 eV according to one or more embodiments. Moreover, the metal-and-halogen-containing precursor may have not been excited in any remote plasma prior to entering the substrate processing region in embodiments. For example, if a remote plasma region or a separate chamber region is present and used to conduct the halogen-containing precursor toward the substrate processing region, the separate chamber region or remote plasma region may be plasma-free as defined herein.

The substrate processing region and any remote regions through which the metal-and-halogen-containing precursors pass may be "hydrogen-free" according to one or more embodiments. Hydrogen and —OH groups, in embodiments, may add material to metals and metal nitrides such that the etch process is hindered. The metal film or the metal nitride film may become thicker instead of thinner. The presence of hydrogen in the substrate processing region may reduce the effective etch selectivity.

In some embodiments, the metal-and-halogen-containing precursor (e.g. $WCl_6$) is supplied with a carrier gas at a flow rate of in the range of about 5 sccm and 500 sccm, in the range of about 10 sccm and 300 sccm, in the range of about 25 sccm and 200 sccm, in the range of about 50 sccm and 150 sccm or in the range of about 75 sccm and 125 sccm.

The reactions may proceed thermally, excited only by the temperature of the substrate itself, according to one or more embodiments. In embodiments which use the temperature of the substrate to effect the etching reaction, the term "plasma-free" may be used herein to describe the substrate processing region during application using no or essentially no plasma power. The plasma power may also be kept below small threshold amounts to enable the appropriate reactions to proceed. The plasma power applied to the substrate processing region may be less than 100 watts, less than 50 watts, less than 30 watts, less than 10 watts and may be 0 watts in various embodiments. The pressure within the substrate processing region may be in the range of about 0.1 Torr and 50 Torr, in the range of about 0.2 Torr and 30 Torr, in the range of about 0.5 Torr and 20 Torr, in the range of about 1 Torr and 10 Torr in embodiments.

Figure 1F:
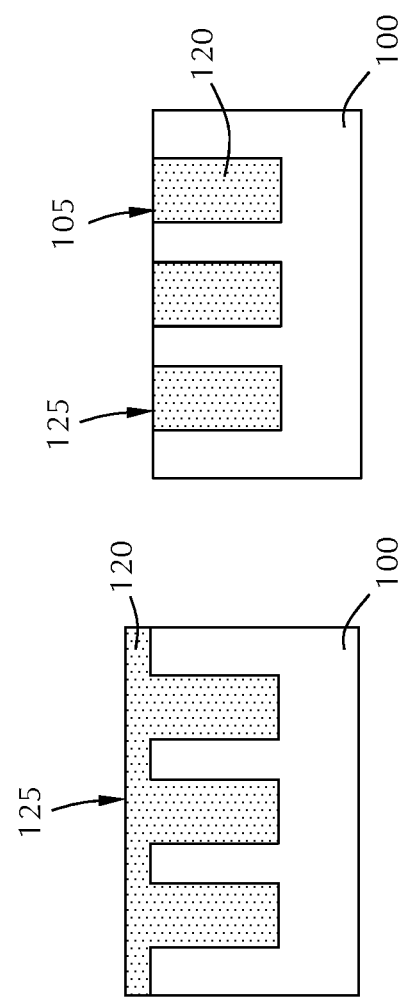

After the substrate surface 105 has been chemically planarized, as shown in FIG. 1F, the first film 120 remaining in the feature 110 is expanded to grow a first pillar in the feature that extends from the feature 110 orthogonally to the substrate surface 105. Expanding the first film 120 of some embodiments comprising oxidizing or nitriding the first film. For example, the first film can be oxidized by exposure to an oxidizing agent or oxidizing conditions to convert the metal or metal containing film to a metal oxide film. The oxidative conversion causes a volumetric expansion of the original film. The expansion of the film can be in the range of about 10% to about 1000%, or in the range of about 50% to about 800%, or in the range of about 100% to about 700%. In some embodiments, the first film 120 expands by an amount greater than or equal to about 150%, 200%, 250%, 300% or 350%. In some embodiments, the first film 120 expands an amount in the range of about 300% to about 400%.

The oxidizing agent can be any suitable oxidizing agent including, but not limited to, $O_2$, $O_3$, $N_2O$, $H_2O$, $H_2O_2$, $CO$, $CO_2$, $NH_3$, $N_2/Ar$, $N_2/He$, $N_2/Ar/He$ and combinations thereof. In some embodiments, the oxidizing conditions comprise a thermal oxidation, plasma enhanced oxidation, remote plasma oxidation, microwave and radio-frequency (e.g., ICP, CCP).

Volumetric expansion by oxidation of the film can occur at any suitable temperature depending on, for example, the composition of the film and the oxidizing agent. In some embodiments, the oxidation occurs at a temperature in the range of about 25° C. to about 1100° C. In some embodiments, oxidation occurs at a temperature greater than or equal to about 250° C., 300° C., 350° C., 400° C., 450° C., 500° C. or 550° C.

During expansion, the fidelity of the feature shape is maintained on the top of the feature so that the film grows straight up from the feature 110 forming a pillar 140. As used in this regard, "straight up" means that the film forms a surface adjacent the feature sidewall 114 that is substantially coplanar with the sidewall 114. A surface is coplanar with the sidewall 114 where the angle formed at the junction of the sidewall 114 and the surface is ±10°. Stated differently, the expanded sidewall forms an angle to the substrate surface 105 in the range of about 80° to about 100°.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the separate processing chamber. Accordingly, the processing apparatus may comprise multiple chambers in communication with a transfer station. An apparatus of this sort may be referred to as a "cluster tool" or "clustered system," and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present invention are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, similar to a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discreet steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

What is claimed is:

1. A processing method comprising:
providing a substrate with a substrate surface having at least one feature extending into the substrate from the substrate surface, the feature having a bottom and sidewalls;
depositing a first film comprising a metal on the substrate surface so that the first film covers the substrate surface and fills the feature;
chemically planarizing the substrate surface by sequentially oxidizing a top of the first film to form an oxidized first film on top of the first film and etching the oxidized first film to remove the oxidized first film, the sequential oxidizing and etching repeated to remove the first film from the substrate surface leaving the first film in the feature; and
expanding the first film to grow a first pillar in the feature that extends from the feature orthogonally to the substrate surface.

2. The method of claim 1, wherein the metal comprises tungsten.

3. The method of claim 1, wherein depositing the first film and chemically planarizing the substrate surface occurs in the same processing chamber.

4. The method of claim 1, wherein expanding the first film to grow the first pillar comprises one or more of oxidizing or nitriding the first film.

5. The method of claim 4, wherein the first pillar is grown by exposure to one or more of $O_2$, $O_3$, $H_2O$, $H_2O_2$, $H_2O_4$ or $N_2O$.

6. The method of claim 1, wherein removing the first film to expose the substrate surface comprises substantially no mechanical planarization.

7. The method of claim 1, wherein etching the oxidized first film comprises exposing the first film to a metal halide compound.

8. The method of claim 7, wherein the metal halide compound and the first film have the same metal.

9. The method of claim 1, wherein depositing the first film comprises an atomic layer deposition process.

10. The method of claim 9, wherein depositing the first film comprises sequential exposure to a metal halide precursor and a reactant to deposit a metal film.

11. The method of claim 10, wherein chemically planarizing the first film comprises exposure of the oxidized first film to the same metal halide precursor.

12. The method of claim 11, wherein the metal halide precursor comprises a tungsten halide.

13. The method of claim 12, wherein the tungsten halide comprises one or more of $WCl_5$ or $WCl_6$.

14. A processing method comprising:
providing a substrate with a substrate surface having at least one feature extending into the substrate from the substrate surface, the feature having a bottom and sidewalls;
depositing a first film comprising a metal on the substrate surface so that the first film covers the substrate surface and fills the feature;
chemically planarizing the substrate surface by sequentially oxidizing a top of the first film to form an oxidized first film on top of the first film and etching the oxidized first film to remove the oxidized first film, the sequential oxidizing and etching repeated to remove the first film from the substrate surface leaving the first film in the feature; and
expanding the first film to grow a first pillar in the feature that extends from the feature orthogonally to the substrate surface.

15. The method of claim 14, wherein depositing the first film and chemically planarizing the substrate surface occurs in the same processing chamber.

16. The method of claim 14, wherein expanding the first film to grow the first pillar comprises one or more of oxidizing or nitriding the first film.

17. The method of claim 14, wherein the metal comprises tungsten.

18. The method of claim 17, wherein depositing the first film comprises sequential exposure of the substrate surface to a metal halide precursor and a reactant to deposit a metal film and chemically planarizing the first film comprises exposure of the oxidized first film to the same metal halide precursor.

19. A processing method comprising:
providing a substrate with a substrate surface having at least one feature extending into the substrate from the substrate surface, the feature having a bottom and sidewalls;
depositing a first film on the substrate surface by sequential exposure to a metal precursor and a reactant to form a first film that covers the substrate surface and fills the feature, the first film comprising tungsten metal and the metal precursor comprising a tungsten halide;
chemically planarizing the substrate surface by sequentially oxidizing a top of the first film to form an oxidized first film on top of the first film and etching the oxidized first film by exposure to the same tungsten halide compound as the metal precursor to remove the oxidized first film, the sequential oxidizing and etching repeated to remove the first film from the substrate surface leaving the first film in the feature; and
expanding the first film by one or more of oxidizing or nitriding the first film to grow a first pillar in the feature that extends from the feature orthogonally to the substrate surface,
wherein depositing the first film and chemically planarizing the substrate surface occurs in the same processing chamber.

* * * * *